(12) United States Patent
Akiyama et al.

(10) Patent No.: US 7,642,693 B2
(45) Date of Patent: Jan. 5, 2010

(54) WURTZITE THIN FILM, LAMINATE CONTAINING WURTZITE CRYSTALLINE LAYER AND THEIR MANUFACTURING METHODS

(75) Inventors: Morito Akiyama, Tosu (JP); Naohiro Ueno, Tosu (JP); Hiroshi Tateyama, Tosu (JP); Toshihiro Kamohara, Tosu (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 573 days.

(21) Appl. No.: 10/556,663

(22) PCT Filed: May 14, 2004

(86) PCT No.: PCT/JP2004/006553

§ 371 (c)(1),
(2), (4) Date: Nov. 11, 2005

(87) PCT Pub. No.: WO2004/101842

PCT Pub. Date: Nov. 25, 2004

(65) Prior Publication Data

US 2007/0057285 A1    Mar. 15, 2007

(30) Foreign Application Priority Data

May 15, 2003  (JP)  ............... 2003-137688
May 16, 2003  (JP)  ............... 2003-139506

(51) Int. Cl.
*H01L 41/083* (2006.01)
(52) U.S. Cl. .................. 310/311; 310/313 R (58) Field of Classification Search ............... 310/311, 310/313 R, 313 A, 313 B, 313 C, 313 D, 310/321, 325, 328; 333/186, 187
See application file for complete search history.

(56) References Cited

U.S. PATENT DOCUMENTS 4,567,393 A * 1/1986 Asai et al. ............... 310/313 A (Continued)

FOREIGN PATENT DOCUMENTS

JP  57-048820  3/1982

(Continued)

OTHER PUBLICATIONS

Mikito Kamijo et al.; "Study of deposition of colored films by sputtering method", No. 14, 2000, p. 31-35. Previously provided—English translation of relevant portion attached.

(Continued)

*Primary Examiner*—Walter Benson
*Assistant Examiner*—Derek J Rosenau
(74) *Attorney, Agent, or Firm*—Renner, Otto, Boisselle & Sklar, LLP (57) ABSTRACT

A thin film made of a wurtzite structure compound is manufactured by a reactive sputtering using a metal material as a target, and a nitrogen gas or oxygen gas as a reactive gas. By optimizing film-forming conditions when manufacturing the film, it is possible to obtain a wurtzite thin film whose polarization directions of crystal grains are aligned in a uniform direction. There is provided a laminate including a first wurtzite crystalline layer made of a wurtzite crystalline structure compound is formed in advance between a substrate and a functional material layer that is a ground. Thus it is possible to improve the crystallinity and crystalline orientation of a second wurtzite crystalline layer on the functional material layer.

12 Claims, 3 Drawing Sheets

U.S. PATENT DOCUMENTS

| | | | | |
|---|---|---|---|---|
| 5,426,340 | A | * | 6/1995 | Higaki et al. ............ 310/313 R |
| 6,984,918 | B1 | * | 1/2006 | Hachigo et al. ......... 310/313 R |
| 2002/0190814 | A1 | | 12/2002 | Yamada et al. |
| 2005/0122189 | A1 | * | 6/2005 | Sung .......................... 333/193 |

FOREIGN PATENT DOCUMENTS

| | | |
|---|---|---|
| JP | 60-142607 | 7/1985 |
| JP | 10-122948 | 5/1998 |
| JP | 2004-200843 | 7/2004 |
| WO | 00/76930 | 12/2000 |

OTHER PUBLICATIONS

Yoshihito Maeda et al.; "Direct overwriting in InSbTe phase-change optical disk and the mechanism"; 1988, vol. 88, No. 388, p. 47-52. Previously provided—English translation of relevant portion attached.

European Search Report for corresponding Application No. 04733100.4 dated Mar. 19, 2007.

Cheng H-E et al.; "Preparation of [002] oriented AlN thin films by mid frequency reactive sputtering technique"; Preparation and Characterization, vol. 425, No. 1-2; pp. 85-89; 2003.

European Search Report for corresponding Application No. 04733100.4 dated Jun. 13, 2007.

Yoshimori S. et al.; "Synthesis and AES analysis of Nb(NbN)-AlN multilayers by off-axial DC magnetron sputtering"; Physica C, North-Holland Publishing, Amsterdam, NL; vol. 305, No. 3-4; Sep. 1, 1998; pp. 281-284; XP004150807; ISSN: 0921-4535.

Wang X. et al.; "On the role of laminate architecture in thin film synthesized by ion beam assisted deposition"; Journal of Materials Science Letters, Chapman and Hall Ltd., London, GB; vol. 19, No. 6; Mar. 15, 2000; pp. 485-487, XP001005034; ISSN: 0261-8028.

Lee Si-Hyung et al.; "Growth of highly c-axis textured AlN films on Mo electrodes for film bulk acoustic wave resonators"; Journal of Vacuum Science and Technology A. Vacuum, Surfaces and Films, American Institute of Physics, New York, NY, USA; vol. 21, No. 1; Jan. 2003; pp. 1-5; XP012006270; ISSN: 0734-2101.

Kobyakov V.P.; "Fabrication, microstructure and properties of chemical vapour deposited AlN/Mo laminated composites"; Journal of Materials Science Chapman & Hall UK; vol. 32, No. 16; Aug. 15, 1997; pp. 4347-4353; XP002434516; ISSN: 0022-2461.

International Search Report for corresponding PCT/JP2004/006553, mailed, Aug. 24, 2004.

Morito Akiyama et al.; "Statistical approach for optimizing sputtering conditions of highly oriented aluminum nitride thin films", Thin Solid Films, 1998, vol. 315, p. 62-65.

Morito Akiyama et al.; "Influence of sputtering target material on crystallinity and orientation of AlN thin films", Journal of the Ceramic Society of Japan, 2002, vol. 110, p. 115-117.

Mikito Kamijo et al.; "Study of deposition of colored films by sputtering method", No. 14, 2000, p. 31-35.

Yoshihito Maeda et al.; "Direct overwriting in InSbTe phase-change optical disk and the mechanism"; 1988, vol. 88, No. 388, p. 47-52.

Toshihiro Kamohara, et al.; "Improvement on crystal orientation of AlN thin films by AlN Nanointerlayers", Mar. 28, 2004, No. 1, p. 402, 30p-YN-3.

Morito Akiyama et al.; "Improvement on orientation of AlN thin films by Laminated Electrodes", Mar. 27, 2003, No. 2, p. 691, 30a-S-3.

European Office Action for corresponding Application No. 04733100.4 dated Jun. 23, 2008.

* cited by examiner

(Conventional Art)

(Conventional Art)

WURTZITE THIN FILM, LAMINATE CONTAINING WURTZITE CRYSTALLINE LAYER AND THEIR MANUFACTURING METHODS

TECHNICAL FIELD

The present invention relates to a wurtzite thin film whose crystalline orientation is satisfactory and polarization directions are aligned in a uniform direction, a laminate containing a wurtzite crystalline layer, and their manufacturing methods.

BACKGROUND ART

A semiconductor made of a wurtzite structure compound, such as aluminum nitride (AlN), has a piezoelectric property and a pyroelectric property. Since the wurtzite structure compound has such properties, the wurtzite structure compound is applicable to various devices, such as electronic devices, optical devices and high-pressure proof/high-temperature proof electronic devices.

In fact, the wurtzite structure compound has been applied as a material for various electronic components, such as high-frequency oscillators, filters for high frequency, various sensors, switches, ultrasonic oscillators, electromechanical transducers for audible bandwidth and light emitting elements.

Among the wurtzite structure compounds, AlN has especially been drawing researchers' attentions since AlN was synthesized for the first time in the middle of the 19$^{th}$ century. AlN is a material of a hexagonal wurtzite structure compound, and is one of group III-V compounds. The wurtzite structure compound is a compound formed mainly by covalent bond, however AlN is different from other group III-V compounds. That is, AlN is characterized by slightly having ionicity.

The following is four basic characteristics of the wurtzite structure compound.

(1) chemically stable at high temperatures
(2) high in corrosion resistance with respect to molten metal
(3) excellent in electric insulation
(4) high in thermal conductivity Moreover, it is well-known that the wurtzite structure compound has the piezoelectric property and the pyroelectric property since the wurtzite structure compound has a crystal form having no symmetry center.

As a method for synthesizing a thin film or a monocrystal from the wurtzite structure compound, various methods have been studied, such as a reactive sputtering that is one of physical vapor depositions (PVD), a molecular beam epitaxy, a laser ablation, an ion plating, a chemical vapor deposition (CVD) using aluminum chloride and ammonia gas and metalorganic CVD using trimethyl aluminum and ammonia gas.

Most of these studies aim to realize the practical utilization of an electronic/optical functional thin film made of the wurtzite structure compound. Especially, since AlN is the highest in the propagation speed of a surface acoustic wave (SAW) among piezoelectric substances, applying AlN as a SAW device, typically a SAW filter of high-frequency region, and a bulk acoustic wave (BAW) is expected.

Incidentally, in order to fully obtain properties of electronic component materials using the wurtzite structure compound, it is necessary in most cases to control the crystallinity and crystalline orientation of the wurtzite structure compound. On this account, an epitaxial technique using a monocrystalline substrate and a technique for controlling the crystallinity and the crystalline orientation by adding impurities have been proposed.

For example, an AlN film formed by sputtering has a polycrystalline structure in many cases. However, in order to utilize such AlN film as the piezoelectric substance, the orientation of a crystal axis needs to be controlled in a film-forming process. In the case of AlN, a (0002) surface orientation is ideal. Many studies have been made to realize this ideal.

Moreover, piezoelectric ceramics formed on a substrate as a thin film is required to have a high Curie point of 1,000° C. or more and be able to deal with a high vibration frequency of thousands of MHz or more. In the case of practically forming the piezoelectric ceramics on a substrate as a thin film, it is possible to accordingly select the piezoelectric ceramics having such properties.

Specifically, the piezoelectric ceramics having such properties is exemplified by perovskite oxide, $LiNbO_3$ oxide and a wurtzite compound, and the wurtzite compound is exemplified by AlN, ZnO, etc. Between ZnO (zinc oxide) and AlN (aluminum nitride), a thin film oriented in a c-axis direction is advantageous in that the thin film can be formed even if the substrate is a sintered body (see Document 1 (Japanese Unexamined Patent Application No. 122948/1998 (Tokukaihei 10-122948), published on May 15, 1998)).

However, in order to obtain an effective piezoelectric property, not only the crystalline orientations but also spontaneous polarization directions of respective crystal grains need to be aligned in a uniform direction. This is because crystal grains polarized in opposite directions decrease the overall piezoelectric effect.

Unlike ferroelectric substances, such as lead zirconium titanate (PZT), a polarization treatment cannot be carried out with respect to the wurtzite structure compound after the film formation. Therefore, studies of the polarization have not been made until now. In the case of the wurtzite structure compound, the control of the polarization directions and the film formation need to be carried out simultaneously.

The present invention was made in view of the above-described problems, and is to provide a thin film containing the wurtzite structure compound whose crystalline orientation is satisfactory and the spontaneous polarization directions are aligned in a uniform direction, and a method for manufacturing the thin film.

Incidentally, in the case of applying a wurtzite crystalline structure compound as the electronic component material, the wurtzite crystalline compound needs to be, in many cases, complexed with a functional material having conductivity and other function(s). Therefore, it is necessary to form a laminate having a multilayer structure in which a layer made of the wurtzite crystalline structure compound whose crystallinity and crystalline orientation are controlled is formed on a functional material layer made of such arbitrary functional material (for example, see Document 2 (Japanese Unexamined Patent Application No. 142607/1985 (Tokukaisho 60-142607), published on Jul. 27, 1985)).

However, in the case of forming the layer made of the wurtzite crystalline structure compound on the functional material layer that is a ground, there is a problem in that it is difficult to control the crystallinity and crystalline orientation of the wurtzite crystalline structure compound.

Figure 6:
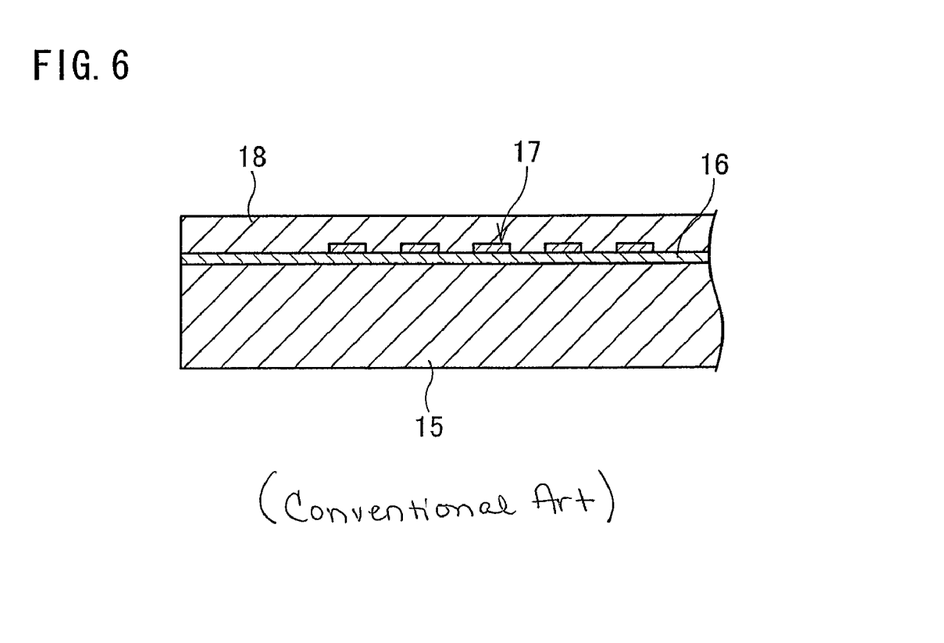
FIG. 6 is a cross-sectional diagram showing a conventional laminate.

In order to solve this problem, Document 3 (Japanese Unexamined Patent Application No. 48820/1982 (Tokukaisho 57-48820), published on Mar. 20, 1982) discloses a surface acoustic wave element including, as shown in FIG. 6, (i) a substrate 15, (ii) a first wurtzite structure piezoelectric thin film 16 formed on the substrate 15, (iii) electrodes 17 each of which is formed on the first wurtzite structure piezoelectric thin film 16 by photo-etching to be a predetermined shape and is made of a material having a face-centered cubic structure and (iv) a second wurtzite structure piezoelectric thin film 18 which is also formed on the first wurtzite structure piezoelectric thin film 16 while containing the electrodes 17. In the surface acoustic wave element, the first wurtzite structure piezoelectric thin film 16 functions so as to mainly improve orientations of the electrodes 17 and hence an orientation of the wurtzite structure piezoelectric thin film 18.

In Document 3, as shown in FIG. 6, the first wurtzite structure piezoelectric thin film 16 is formed between the substrate 15 and the electrodes 17 in order to improve the orientation of the second wurtzite structure piezoelectric thin film 18 formed on the electrodes 17 that are island shaped. However, depending on the electronic component material, it may be necessary to use a laminate in which a second wurtzite crystalline structure compound layer is formed on a functional material layer, such as the electrode 17 which not partially but entirely covers a first wurtzite crystalline structure compound layer.

However, in the case of forming the second wurtzite crystalline compound layer on the functional material layer which not partially but entirely covers the first wurtzite crystalline compound layer, there are problems in that an internal stress of the functional material layer is large and the second wurtzite crystalline structure compound layer is easily peeled off.

Moreover, in the case in which the functional material layer is made of a metal having a body-centered cubic structure or a hexagonal close-packed lattice structure, the control of the crystallinity and crystalline orientation of the wurtzite crystalline layer formed on the functional material layer is more difficult than that in the case in which the functional material layer is made of a material having the face-centered cubic structure, and actually a method for controlling these has not been found so far. This is because, as compared with the functional material having the face-centered cubic structure, (i) the functional material having the body-centered cubic structure or the hexagonal close-packed lattice structure is largely different in lattice constant from the wurtzite crystal and (ii) the functional material having the body-centered cubic structure is low in crystallinity.

The present invention provides not only (i) a thin film containing a wurtzite structure compound whose polarization directions are aligned in a uniform direction and (ii) a method for manufacturing the thin film but also (iii) a laminate having a multilayer structure in which a layer made of the wurtzite crystalline structure compound whose crystallinity and crystalline orientation are controlled is formed on a functional material layer regardless of the crystalline structure of the functional material layer and (iv) a method for manufacturing the laminate.

DISCLOSURE OF INVENTION

In view of the above problems, the present inventors diligently studied a method for manufacturing a wurtzite structure compound thin film, whose polarization directions are aligned in a uniform direction, by using a reactive sputtering which uses a metal material as a target, and a nitrogen gas or an oxygen gas as a reactive gas. As a result, the present inventors found out that it is possible to solve the above problems by optimizing film-forming conditions for manufacturing the thin film by sputtering, that is, a substrate temperature, a sputtering pressure, a nitrogen concentration or an oxygen concentration, a high-frequency power density and a film thickness. This finding has led to the completion of the present invention.

In addition, as a result of diligent studies in view of the above problems, the present inventors found out that it is possible to improve the crystallinity and crystalline orientation of the second wurtzite crystalline layer by (i) forming in advance the first wurtzite crystalline layer under the functional material layer that is a ground, that is, between the substrate and the functional material layer and then (ii) forming the second wurtzite crystalline layer on the functional material layer. This finding has led to the completion of the present invention.

That is, a wurtzite thin film of the present invention is a wurtzite thin film containing crystals of a wurtzite structure compound, and a polarizability X of crystal grains of the crystals is in a range of $51\% \leqq X \leqq 100\%$.

The crystal grains of the wurtzite structure compound are polarized between positive (plus) and negative (minus). The above expression "a polarizability of crystal grains" indicates a higher percentage between a percentage of positively-polarized (plus) crystal grains in the entire crystal grains and a percentage of negatively-polarized (minus) crystal grains in the entire crystal grains.

As described above, it is well-known that the wurtzite structure compound has the piezoelectric property and the pyroelectric property since the wurtzite structure compound has a crystal form having no symmetry center. Therefore, the following has been attempted: The wurtzite structure compound is formed on the substrate in the form of a thin film to use the thin film as the electronic component material having the piezoelectric property and the pyroelectric property.

In the case of using as the electronic component material the thin film made of the wurtzite structure compound, it is important to form the thin film so that the polarization directions of the crystal grains are adequately aligned in a uniform direction. In this way, the thin film can obtain the effective piezoelectric property. Note that the polarization directions are adequately aligned in a uniform direction when the polarizability of the crystal grains is 51% or more.

As described above, the polarizability of the crystal grains in the wurtzite thin film of the present invention is 51% or more, that is, the wurtzite thin film of the present invention has the adequate polarizability to obtain the effective piezoelectric property. Therefore, the wurtzite thin film of the present invention can be effectively utilized for various electronic components as the electronic component material having the piezoelectric property.

In the wurtzite thin film, it is preferable that the crystals of the wurtzite structure compound orient with respect to a (0002) surface. With this, it is possible to add the effective piezoelectric property by the wurtzite thin film.

It is preferable that the wurtzite thin film of the present invention be made of one compound selected from the group consisting of aluminum nitride, gallium nitride, indium nitride and zinc oxide, or be made of two compounds or more selected from the group consisting of aluminum nitride, gallium nitride, indium nitride and zinc oxide.

A method of the present invention is a method for manufacturing a wurtzite thin film containing crystals of a wurtzite structure compound, and the wurtzite thin film is formed by sputtering so that a polarizability X of crystal grains in the wurtzite thin film is in a range of $51\% \leqq X \leqq 100\%$.

According to the above method, the polarizability of the crystal grains in the wurtzite thin film is 51% or more. That is, it is possible to manufacture the wurtzite thin film having an adequate polarizability to obtain the effective piezoelectric property. Therefore, the wurtzite thin film manufactured by the method of the present invention can be effectively utilized for various electronic components as the electronic component material having the piezoelectric property.

In the above method, it is preferable that the wurtzite thin film be formed on a substrate having any one of a monocrystalline structure, a polycrystal structure and an amorphous structure.

Moreover, in the above method, it is preferable that a temperature of the substrate be in a range from a room temperature to 800° C. when forming the wurtzite thin film on the substrate. Note that the above "room temperature" indicates the temperature of a room where the wurtzite thin film is manufactured.

In the above method, it is preferable that a sputtering pressure be in a range from 0.05 Pa to 0.5 Pa when forming the wurtzite thin film by sputtering.

In the above method, it is preferable that a sputtering gas used for sputtering include at least argon and nitrogen, and a nitrogen concentration in the sputtering gas be in a range from 5% to 90%.

In the above method, it is preferable that the sputtering gas contain 0.2% to 10% of oxygen.

In the above method, it is preferable that a high-frequency power density used for forming the wurtzite thin film by sputtering be in a range from 1 W/cm$^2$ to 12 W/cm$^2$.

In the above method, it is preferable that the wurtzite thin film be formed so as to have a thickness of 25 nm or more.

In the above method, it is preferable that the wurtzite thin film be made of one compound selected from the group consisting of aluminum nitride, gallium nitride, indium nitride and zinc oxide, or be made of two compounds or more selected from the group consisting of aluminum nitride, gallium nitride, indium nitride and zinc oxide.

In the method for manufacturing the wurtzite thin film in accordance with the present invention, it is possible to further improve the polarizability of the crystal grains in the wurtzite thin film by adopting the above-descried film-forming conditions. Therefore, it is possible to manufacture the wurtzite thin film which has much better piezoelectric property and is more useful as the electronic component material.

Moreover, a laminate of the present invention includes: a substrate; a first wurtzite crystalline layer made of a wurtzite crystalline structure compound; a functional material layer which covers an entire region of the first wurtzite crystalline layer; and a second wurtzite crystalline layer which covers the functional material layer and is made of the wurtzite crystalline structure compound, and the first wurtzite crystalline layer, the functional material layer and the second wurtzite crystalline layer are stacked on or above the substrate.

In the above laminate, it is preferable that the substrate be made of any one of a monocrystalline material, a polycrystal material and an amorphous material.

Moreover, in the above laminate, it is preferable that a c axis perpendicular to a (0001) surface of the wurtzite crystalline structure compound constituting the first wurtzite crystalline layer and the second wurtzite crystalline layer orient substantially perpendicular to a surface of the substrate.

In the laminate of the present invention, it is preferable that the first wurtzite crystalline layer and/or the second wurtzite crystalline layer contain as a main constituent one compound or more selected from the group consisting of aluminum nitride, gallium nitride, indium nitride and zinc oxide.

Moreover, in the laminate of the present invention, it is preferable that the first wurtzite crystalline layer and the second wurtzite crystalline layer contain aluminum nitride as the main constituent.

Further, in the laminate of the present invention, it is preferable that the first wurtzite crystalline layer and the second wurtzite crystalline layer are made of a same constituent(s).

In the laminate of the present invention, the functional material layer contains any one of a monocrystalline material, a polycrystalline material and an amorphous material. Moreover, in the above laminate, it is preferable that the functional material layer contain a conductive material. It is more preferable that the functional material layer contain a metal. It is especially preferable that the functional material layer contain a metal having a body-centered cubic structure or a hexagonal close-packed lattice structure. In the laminate of the present invention, the functional material constituting the functional material layer is exemplified by an elementary substance of molybdenum or tungsten, and a compound containing at least one of molybdenum and tungsten.

In the laminate of the present invention, it is preferable that the first wurtzite crystalline layer have a thickness of 5 nm or more. It is more preferable that the first wurtzite crystalline layer have a thickness of 50 nm to 200 nm.

A method of the present invention is a method for manufacturing the above laminate, and the method includes the steps of: forming on a substrate a first wurtzite crystalline layer made of a wurtzite crystalline structure compound; forming a functional material layer so that the functional material layer covers the first wurtzite crystalline layer; and forming on the functional material layer a second wurtzite crystalline layer made of the wurtzite crystalline structure compound, and at least one of the steps is carried out by a vapor deposition.

Moreover, in the above method, it is preferable that the vapor deposition is a physical vapor deposition and/or a chemical vapor deposition.

In the above method, the physical vapor deposition is typically exemplified by a vacuum deposition, a molecular beam epitaxy, a laser ablation, a sputter deposition, an ion plating, an ion cluster beam deposition and an ion beam deposition.

Moreover, in the above method, the chemical vapor deposition is typically exemplified by a thermal CVD, a photochemical vapor deposition, a high-frequency plasma CVD, a micro wave plasma CVD, an ECR plasma CVD and a DC plasma CVD.

With the above structure or method, it is possible to manufacture the laminate having the multilayer structure in which the wurtzite crystalline layer whose crystallinity and crystalline orientation are satisfactory and the functional material layer are complexed with each other regardless of the crystalline structure of the functional material layer. Therefore, it is possible to improve the quality of the electronic component material made by complexing the wurtzite crystalline structure compound with the functional material having conductivity, etc.

Additional objects, features, and strengths of the present invention will be made clear by the description below. Further, the advantages of the present invention will be evident from the following explanation in reference to the drawings.

BEST MODE FOR CARRYING OUT THE INVENTION

The following will explain an embodiment of the present invention.

The present embodiment first describes a wurtzite thin film of the present invention and a method for manufacturing the wurtzite thin film.

(1) Wurtzite Thin Film and Method for Manufacturing the Same

The wurtzite thin film of the present invention contains crystals of a wurtzite structure compound, and is characterized in that a polarizability X of crystal grains of the crystals is in a range of $51\% \leqq X \leqq 100\%$. In the case of utilizing the wurtzite thin film as an electronic component material, the wurtzite thin film has an adequate piezoelectric property.

For example, in order that an AlN thin film has the adequate piezoelectric property, it is important that crystals of AlN orient with respect to a (0002) surface. Therefore, studies of manufacturing conditions have been made so that, by optimizing conditions of sputtering, it is possible to manufacture on any substrates the AlN film whose crystalline structure orients with respect to the (0002) surface.

Figure 2:
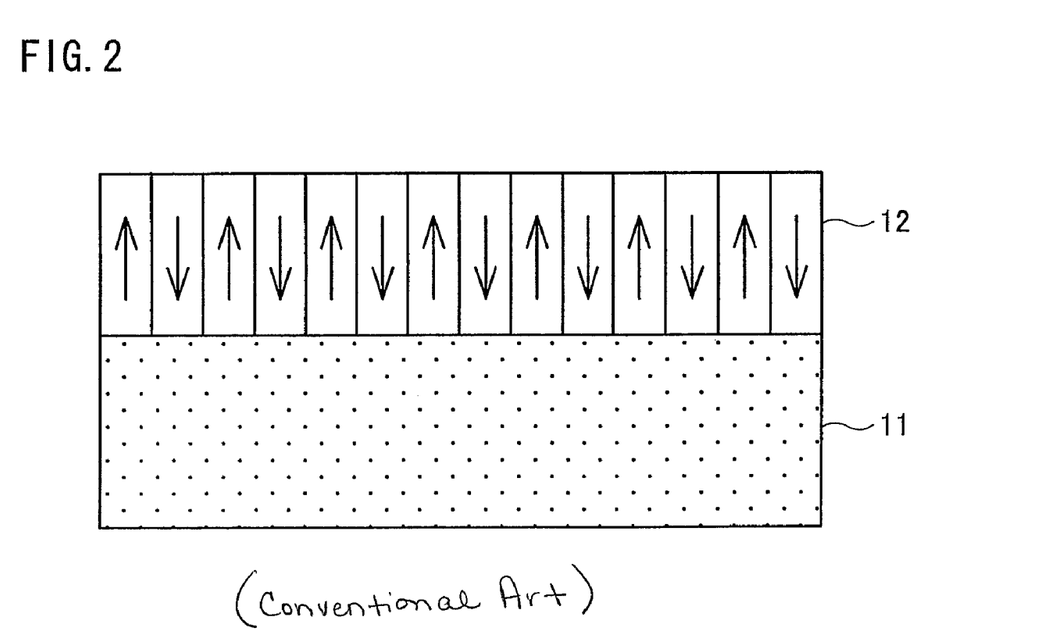
FIG. 2 is a cross-sectional diagram showing polarization directions in a wurtzite thin film obtained by a conventional method for manufacturing the wurtzite thin film.

However, it is still difficult for AlN whose crystals orient with respect to the (0002) surface to obtain the adequate piezoelectric property. The present inventors assumed that the reason for this is a misalignment of the polarization directions as shown in FIG. 2. Note that FIG. 2 is a cross-sectional diagram showing a wurtzite thin film 12 formed on a substrate 11 by a conventional method. As shown in FIG. 2, the polarization directions (indicated by arrows in FIG. 2) of the AlN film (wurtzite thin film) 12 formed on the substrate 11 by the conventional method are not aligned in a uniform direction. Therefore, there are problems in that a piezoelectric effect obtained by the crystals is cancelled and an overall piezoelectric effect is decreased.

Figure 1:
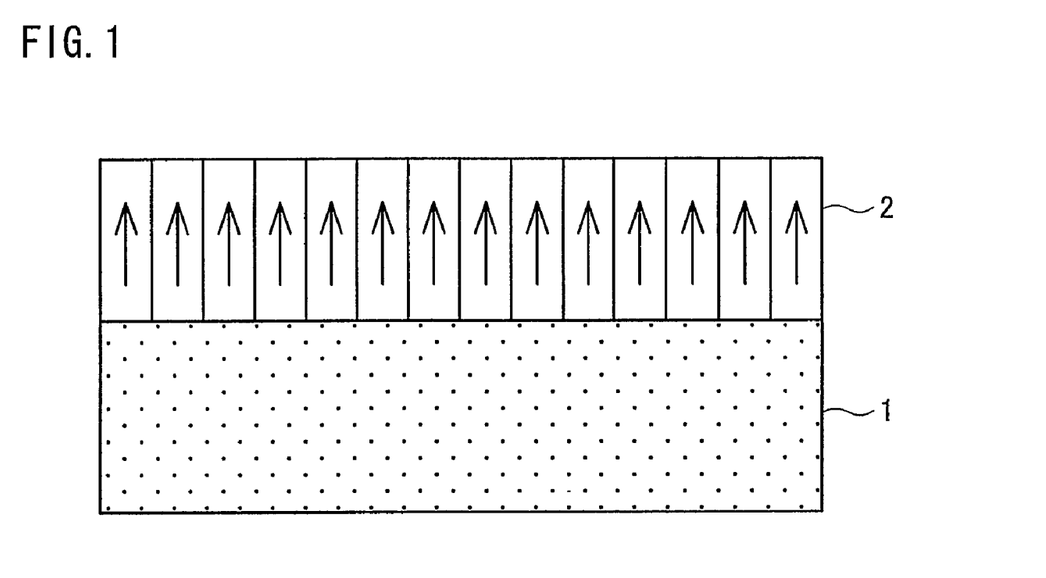
FIG. 1 is a cross-sectional diagram showing polarization directions in a wurtzite thin film obtained by a method for manufacturing the wurtzite thin film of the present invention.

The present inventors further studied the conditions of sputtering, and found out the manufacturing conditions for AlN whose crystals orient with respect to the (0002) surface and polarization directions are aligned in a uniform direction as shown in FIG. 1. FIG. 1 is a cross-sectional diagram showing a wurtzite thin film 2 formed on a substrate 1 by the method of the present invention. In the AlN film (wurtzite thin film) 2, shown in FIG. 1, formed on the substrate 1 by the method of the present invention, 51% to 100% of the polarization directions of the crystal grains of AlN are aligned in a uniform direction. Note that arrows in FIG. 1 show the polarization directions of the crystal grains in the AlN film.

The following will explain specific film-forming conditions in the method for manufacturing the wurtzite thin film of the present invention. In other words, the following will explain the film-forming conditions for the wurtzite thin film so that the polarizability X of the crystal grains in the obtained thin film is in a range of $51\% \leqq X \leqq 100\%$.

A substrate temperature when carrying out sputtering is in a range from the room temperature to 800° C.

A sputtering pressure is in a range from 0.05 Pa to 5.0 Pa.

A sputtering gas is a mixed gas of argon and nitrogen, and a nitrogen concentration in the mixed gas is in a range from 5% to 90%. Moreover, in the case of adding oxygen, an oxygen concentration in the mixed gas is in a range from 0.2% to 10%.

A high-frequency power is in a range from 1 W/cm$^2$ to 20 W/cm$^2$.

A film thickness of the AlN film is in a range from 25 nm to 100 μm.

The following will explain more preferable film-forming conditions for manufacturing the wurtzite thin film of the present invention.

It is more preferable that the substrate temperature when carrying out sputtering is in a range from 300° C. to 400° C. Moreover, it is more preferable that the sputtering pressure is in a range from 0.5 Pa to 1 Pa. Further, it is more preferable that the high-frequency power is in a range from 4 W/cm$^2$ to 8 W/cm$^2$.

By setting the substrate temperature, the sputtering pressure and the high-frequency power as above for the film formation, it is possible to further improve the polarizability X of the crystal grains in the obtained wurtzite thin film. Therefore, with the above-described more preferable film-forming conditions, it is possible to improve the piezoelectric property of the wurtzite thin film and obtain the wurtzite thin film which is more useful as the electronic component material.

The following will explain the substrate 1 used for manufacturing the wurtzite thin film of the present invention. The substrate 1 may be made of a monocrystalline material, a polycrystalline material or an amorphous material. Moreover, the substrate 1 may be partially crystallized.

As a material of the substrate 1, it is possible to use insulating ceramics which is one of functional ceramics. Basic natures required for the material of the substrate 1 are high insulation property, thermal conductivity, low dielectric constant, compatibility with other element(s), chemical stability and sinterability.

More specifically, as the material of the substrate 1, it is possible to use (i) the monocrystal, such as Si, sapphire, rock crystal, magnesium oxide, lithium niobate and lithium tantalate, (ii) the polycrystal, such as ceramics that are typically aluminum oxide, silicon nitride, silicon carbide and zirconium oxide and (iii) the amorphous, such as glass, metallic glass and carbon. Thus, the crystalline structure of the substrate 1 is not especially limited.

The foregoing description took AlN as an example of the wurtzite structure compound, and explained the manufacturing conditions for manufacturing the wurtzite thin film whose polarization directions are aligned in a uniform direction. However, the present invention is not limited to AlN, and it is possible to improve the piezoelectric property of a wurtzite thin film even in the case in which the wurtzite thin film is made of other wurtzite structure compound (for example, zinc oxide) with the above manufacturing conditions.

The following will explain a laminate containing a wurtzite crystal of the present invention and a method for manufacturing the laminate.

(2) Laminate Containing Wurtzite Crystalline Layer

Figure 3:
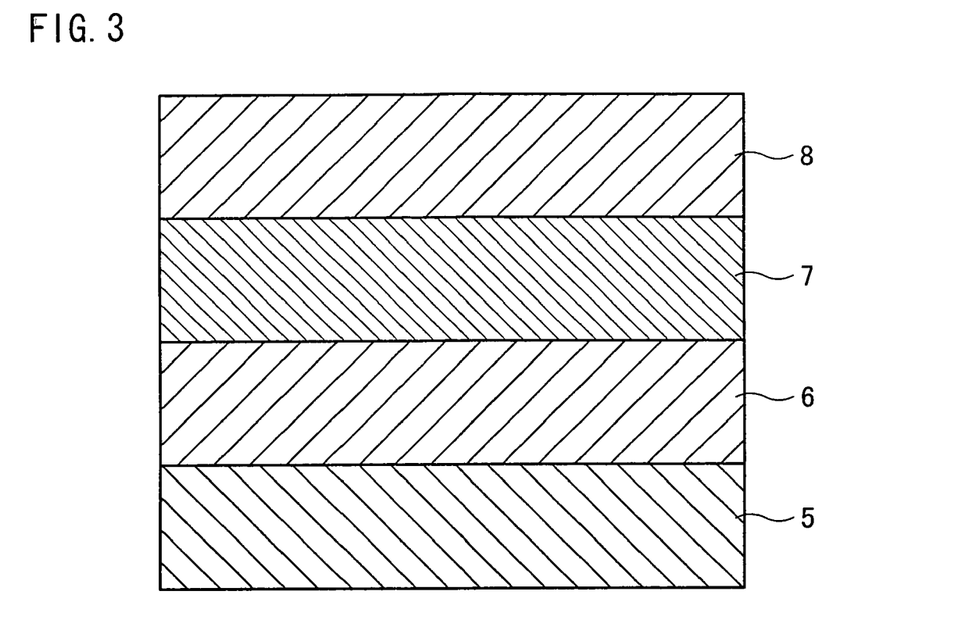
FIG. 3 is a cross-sectional diagram showing a laminate of the present invention.

The following will explain the laminate of the present invention in reference to FIG. 3. FIG. 3 is a cross-sectional diagram showing a schematic structure of the laminate containing the wurtzite crystalline structure compound of the present invention.

The laminate of the present invention is formed so that a first wurtzite crystalline layer 6, a functional material layer 7 and a second wurtzite crystalline layer 8 are stacked in this order on a substrate 5 and substantially in parallel with the substrate 5. More specifically, the laminate of the present invention has a laminated structure in which (i) the first wurtzite crystalline layer 6 is formed on the substrate 5, (ii) the functional material layer 7 covers an entire region of the first wurtzite crystalline layer 6 and (iii) the second wurtzite crystalline layer 8 is further formed on the functional material layer 7. Details of each layer will be described later.

By using the laminate in which the functional material layer 7 having the conductivity and other function(s) and the first and second wurtzite crystalline layer 6 and 8 are complexed with each other, it is possible to improve the crystallinity and crystalline orientation of the second wurtzite crystalline layer formed on the functional material layer 7.

The laminate of the present invention is formed so that the first wurtzite crystalline layer 6, the functional material layer 7 and the second wurtzite crystalline layer 8 are stacked in this order on the substrate 5, however it is possible to use the laminate whose substrate 5 is removed according to need.

The following will explain in detail the substrate 5, the first and second wurtzite crystalline layers 6 and 8 and the functional material layer 7 which constitutes the laminate of the present invention.

<Substrate 5>

The substrate 5 is not especially limited, but may be made of a monocrystalline material, a polycrystalline material or an amorphous material. Moreover, the substrate 5 may be partially crystallized.

More specifically, as the material of the substrate 5, it is possible to use (i) the monocrystal, such as Si, sapphire, rock crystal, magnesium oxide, lithium niobate and lithium tantalate, (ii) the polycrystal, such as ceramics that are typically aluminum oxide, silicon nitride, silicon carbide and zirconium oxide and (iii) the amorphous, such as glass, metallic glass and carbon. However, the present invention is not limited to these. That is, the crystalline structure of the substrate 5 is not especially limited.

Note that the laminate shown in FIG. 3 has a four-layer structure in which the first wurtzite crystalline layer 6, the functional material layer 7 and the second wurtzite crystalline layer 8 are formed in this order on the substrate 5. However, depending on circumstances, it is possible to use the laminate having a three-layer structure in which the substrate 5 is removed from the laminate having the four-layer structure.

<First and Second Wurtzite Crystalline Layers 6 and 8>

The first and second wurtzite crystalline layers 6 and 8 are not especially limited as long as the first and second wurtzite crystalline layers 6 and 8 are made of the wurtzite crystalline structure compound.

It is preferable that the wurtzite crystalline structure compound contain as a main constituent, for example, aluminum nitride, gallium nitride, indium nitride or zinc oxide. It is more preferable that the wurtzite crystalline structure compound contain aluminum nitride as the main constituent.

The above expression "contains as a main constituent" indicates that the amount of the main constituent is the largest among constituents in the wurtzite crystalline structure compound. Therefore, each of the first wurtzite crystalline layer 6 and the second wurtzite crystalline layer 8 may be a layer made of a single wurtzite crystalline structure compound, a layer made of mixed crystals containing two or more wurtzite crystalline structure compounds or a layer further containing other compound(s). The "other compound(s)" is not especially limited as long as the "other compound(s)" does not affect the crystallinity and crystalline orientation of the first wurtzite crystalline layer 6 and the second wurtzite crystalline layer 8.

Moreover, it is preferable that the first wurtzite crystalline layer 6 and the second wurtzite crystalline layer 8 are made of the same constituent, however the first wurtzite crystalline layer 6 and the second wurtzite crystalline layer 8 can be made of different constituents.

It is preferable that a c axis of the first wurtzite crystalline layer 6 orient substantially perpendicular to a surface of the substrate. With this, a c axis of a wurtzite crystalline layer constituting the second wurtzite crystalline layer 8 orients in a direction substantially perpendicular to the surface of the substrate 5. That is, it is possible to form the second wurtzite crystalline layer 8 having satisfactory crystallinity and crystalline orientation on the functional material layer 7.

An object of the present invention is to form on the functional material layer 7 the second wurtzite crystalline layer 8 whose crystallinity and crystalline orientation are improved. However, as described above, it is preferable that not only the wurtzite crystalline layer 8 but also a c axis of the first wurtzite crystalline layer 6 and a c axis of the wurtzite crystalline structure compound constituting the second wurtzite crystalline layer 8 orient substantially perpendicular to the surface of the substrate.

It is preferable that the c axis of the second wurtzite crystalline layer orient substantially perpendicular to the surface of the substrate. This keeps the quality of the crystallinity of the second wurtzite crystalline layer 8 high. Therefore, the wurtzite crystalline structure compound shows high performances, such as a higher hardness, a higher sound speed and a wider bandgap. It is possible to improve the quality of the electronic component material obtained by complexing the wurtzite crystalline structure compound with the functional material having functions, such as conductivity, etc.

Note that the c axis of is an axis perpendicular to a (0001) surface of the wurtzite crystalline structure compound which constitutes the first wurtzite crystalline layer 6 and the second wurtzite crystalline layer 8.

The thickness of the second wurtzite crystalline layer 8 is not especially limited, and is determined depending on how the laminate is used.

Moreover, the thickness of the first wurtzite crystalline layer 6 is not especially limited as long as the thickness is a thickness necessary for obtaining such crystalline orientation that the c axis of the second wurtzite crystalline layer 8 orients substantially perpendicular to the surface of the substrate. More specifically, it is preferable that the thickness of the first wurtzite crystalline layer 6 be 5 nm or more, more preferably 50 nm to 200 nm, further preferably 80 nm to 120 nm. It is especially preferable that the thickness of the first wurtzite crystalline layer 6 be 100 nm.

With this, even in the case in which the functional material layer 7 has the body-centered cubic structure or the hexagonal close-packed lattice structure, it is possible to control the crystallinity and crystalline orientation of the second wurtzite crystalline layer 8 formed on the functional material layer 7. That is, in the case in which the functional material layer 7 has the body-centered cubic structure or the hexagonal close-packed lattice structure, it is more difficult to control the crystallinity and crystalline orientation of the second wurtzite crystalline layer 8 formed on the functional material layer 7 than the case in which the functional material layer 7 has the face-centered cubic structure. However, by setting the thickness of the first wurtzite crystalline layer 6 as described above, it is possible to obtain such crystalline orientation that the c axis of the second wurtzite crystalline layer 8 orients substantially perpendicular to the surface of the substrate.

According to the above description, the laminate of the present invention may be a laminate which is characterized in that (i) the first wurtzite crystalline layer, (ii) the functional material layer which is so formed as to partially cover the first wurtzite crystalline layer and has the body-centered cubic structure or the hexagonal close-packed lattice structure and (iii) the second wurtzite crystalline layer which covers the first wurtzite crystalline layer while containing the functional material layer are formed on the substrate.

<Functional Material Layer 7>

The functional material layer 7 is formed between the first wurtzite crystalline layer 6 and the second wurtzite crystalline layer 8 which are opposed to each other.

The functional material constituting the functional material layer 7 is not especially limited as long as the functional material is a material having some kind of function(s) and used for the electronic component material which is complexed with the first and second wurtzite crystalline layers 6 and 8. For example, the functions of the functional material are the electric conduction property, the thermal conduction property, the thermal insulation property, the thermal resistance property, the corrosion resistance property, the abrasion resistance property, etc.

The functional material is not especially limited as long as the functional material contains any one of the monocrystalline material, the polycrystalline material and the amorphous material. Moreover, the functional material may be made of any one of the monocrystalline material, the polycrystal material and the amorphous material. Further, the functional material may be partially crystallized. That is, the crystalline structure of the functional material is not especially limited.

It is preferable that the functional material layer 7 contain or be made of, for example, a conductive material, such as metal, semiconductor, conductive polymer and conductive glass, and it is more preferable that the functional material layer 7 contain or be made of a metal. It is further preferable that the functional material layer 7 contain or be made of metal having the body-centered cubic structure or the hexagonal close-packed lattice structure.

With this, it is possible to solve the problems in that the internal stress of the functional material layer 7 is large and the layer is easily peeled off in the case in which the functional material layer 7 covers the entire region of the first wurtzite crystalline layer 6. That is, as compared with a metal having the face-centered cubic structure such as aluminum, a metal having the body-centered cubic structure or the hexagonal close-packed lattice structure such as tungsten and molybdenum has thermal expansion coefficient that is more similar to that of the wurtzite crystalline structure compound. Therefore, even in the case in which the functional material layer 7 covers the entire region of the first wurtzite crystalline layer 6, the internal stress of the functional material layer 7 hardly occurs and the layer is hardly peeled off.

Therefore, it is especially preferable that the functional material be made of an elementary substance of molybdenum or tungsten, or a compound containing at least one of molybdenum and tungsten. Moreover, the functional material may be a mixture containing an elementary substance of molybdenum or tungsten, or a mixture containing a compound containing at least one of molybdenum and tungsten. By using these hard metals, it is possible to supply electronic components which accommodate high vibration frequency.

The metal having the body-centered cubic structure is not especially limited, and is exemplified by barium (BA), chromium (Cr), α-iron (α-Fe), β-iron (β-Fe), δ-iron (δ-Fe), lithium (Li), molybdenum (Mo), natrium (Na), β-titanium (Ti), α-tungsten (W), etc.

Moreover, the metal having the hexagonal close-packed lattice structure is not especially limited, and is exemplified by beryllium (Be), β-calcium (β-Ca), cadmium (Cd), β-cobalt (β-Co), β-chromium (β-Cr), magnesium (Mg), nickel (Ni), titanium (Ti), zinc (Zn), etc.

By forming the wurtzite crystalline layer 8 on the functional material layer 7, it is possible to complex the wurtzite crystalline layer with the functional material layer having functions such as conductivity, etc. Thus, by complexing the wurtzite crystalline compound with various functional materials, the wurtzite crystalline structure compound can be applied to the electronic component material.

The thickness of the functional material layer 7 is not especially limited, and may be determined depending on how the laminate is used.

In order to obtain such crystalline orientation that the c axis of the second wurtzite crystalline layer 8 orients perpendicular to the surface of the substrate, it is preferable that the thickness of the functional material layer 7 be 10 nm or more, more preferable 100 nm to 300 nm, especially preferably 100 nm.

The laminate arranged as above can be utilized as the material of various electronic components, such as high-frequency oscillators, filters for high frequency, various sensors, switches, ultrasonic oscillators, electromechanical transducers for audible bandwidth and light emitting elements. Specific examples are a high-frequency filter and sensor for a next-generation mobile phone, however the present invention is not limited to these. Moreover, by entirely covering the first wurtzite crystalline layer 6 with the functional material layer 7, it is possible to produce a bulk resonator.

(3) Method for Manufacturing Laminate Containing Wurtzite Crystalline Structure Compound A method of the present invention is a method for manufacturing the laminate and is not especially limited as long as the method includes the steps of: forming on the substrate 5 the first wurtzite crystalline layer 6 made of the wurtzite crystalline structure compound; forming the functional material layer 7 in such a manner that the functional material layer 7 covers the first wurtzite crystalline layer 6; and forming on the functional material layer 7 the second wurtzite crystalline layer 8 made of the wurtzite crystalline structure compound.

It is preferable that at least one of the above steps in the method be carried out by the vapor deposition. It is more preferable that two or more of the above steps in the method be carried out by the vapor deposition. It is further preferable that the vapor deposition be the physical vapor deposition and/or the chemical vapor deposition.

Specifically, the physical vapor deposition is exemplified by a vacuum deposition, a molecular beam epitaxy, a laser ablation, a sputter deposition, an ion plating, an ion cluster beam deposition, an ion beam deposition, etc., however the present invention is not limited to these.

Moreover, the chemical vapor deposition is exemplified by a thermal CVD, a photochemical vapor deposition, a high-frequency plasma CVD, a micro wave plasma CVD, an ECR plasma CVD, a DC plasma CVD, etc., however, the present invention is not limited to these.

The step of forming on the substrate 5 the first wurtzite crystalline layer 6 made of the wurtzite crystalline structure compound is not especially limited as long as the step is a step of forming on the substrate a layer made of the wurtzite crystalline structure compound. For example, any one of the above-described vapor depositions can be preferably used for the step.

Moreover, the step of forming the functional material layer 7 in such a manner that the functional material layer 7 covers the first wurtzite crystalline layer 6 is not especially limited. For example, any one of the above-described vapor depositions can be preferably used for the step.

Further, the step of forming on the functional material layer 7 the second wurtzite crystalline layer 8 made of the wurtzite crystalline structure compound is not especially limited. For example, any one of the above-described vapor depositions can be preferably used for the step.

In order that the first wurtzite crystalline layer 6 or the second wurtzite crystalline layer 8 has a c axis orientation, it is preferable to use a pure metal as the material and be formed by the chemical vapor deposition. In the case of using, for example, sputtering, it is preferable to use aluminum as a target and use argon and nitrogen as a gas. In this case, it is preferable that the temperature of the substrate be 200° C. to 400° C.

Moreover, the order of the above-described three steps is not especially limited as long as the order can realize the manufacture of the laminate.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The following will explain Examples of the present invention.

EXAMPLE 1

In Example 1, AlN was used as the wurtzite structure compound so as to form a wurtzite thin film on a substrate. The film-forming conditions are as follows: The substrate temperature was 400° C., the nitrogen concentration was 50%, the high-frequency power density was 7.83 W/cm² and the sputtering pressure was 0.5 Pa. Under these film-forming conditions, the wurtzite thin film was formed on the substrate so that the film thickness of AlN (aluminum nitride) was 1 μm. The polarizability of the wurtzite thin film obtained here was measured and was about 80%, that is, the measurement confirmed that the wurtzite thin film had an adequate polarizability to obtain an effective piezoelectric property.

EXAMPLE 2

Aluminum nitride (AlN) as the first wurtzite crystalline structure compound, molybdenum (Mo) as the functional material and aluminum nitride (AlN) as the second wurtzite crystalline structure compound were formed on an Si monocrystalline substrate by RF magnetron sputtering. The films of the first and second aluminum nitride were formed under the following conditions: Metal aluminum (Al) was used as a target; argon (Ar) and nitrogen (N₂) were used as reactive gas; the substrate temperature was 300° C.; and an RF output was 400 W. Moreover, the film of molybdenum (Mo) was formed under the following conditions: Metal molybdenum (Mo) was used as a target; argon (Ar) was used as reactive gas; no heat was applied; and an RF output was 100 W.

The films were formed so that the film of the first aluminum nitride (AlN) had the thickness of 100 nm, the film of molybdenum (Mo) had the thickness of 200 nm and the film of the second aluminum nitride (AlN) had the thickness of 1 μm.

Figure 4:
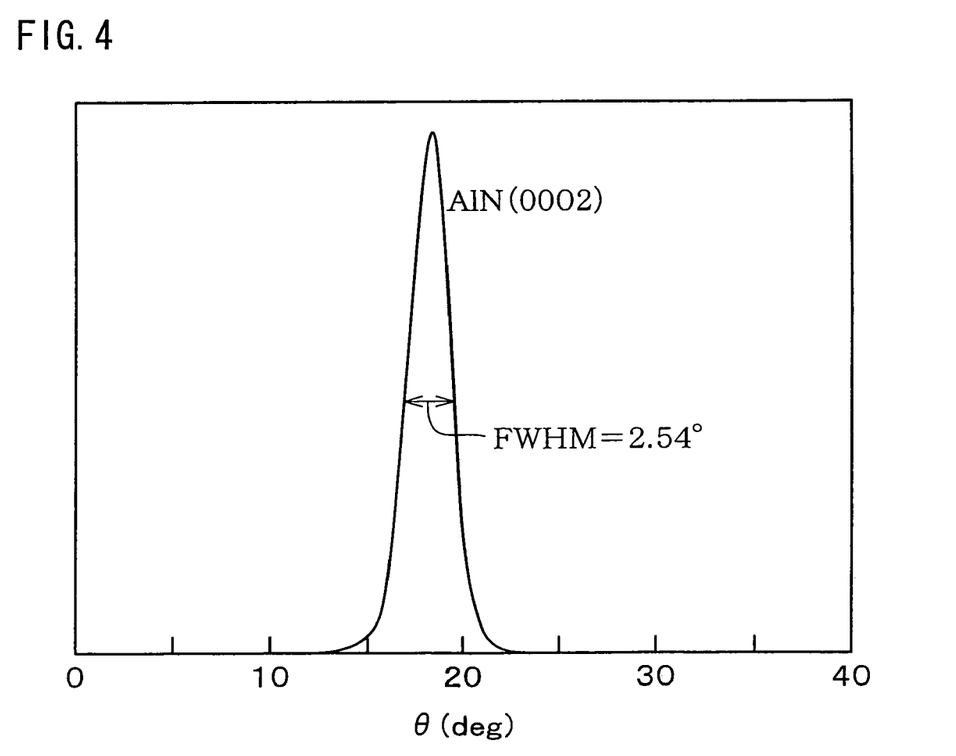
FIG. 4 shows a rocking curve of an AlN (0002) peak in an XRD measurement concerning an AlN/Mo/AlN/Si laminate manufactured in Example.

Obtained here was a rocking curve of an AlN (0002) peak of X-ray diffraction (XRD), and the rocking curve indicates the crystallinity and crystalline orientation of the film of the second aluminum nitride (AlN). The half bandwidth of the rocking curve was 2.54° as shown in FIG. 4, and the film of the second aluminum nitride (AlN) whose c axis orients perpendicular to the substrate was obtained. Note that in FIG. 4, a vertical axis indicates a peak intensity and a horizontal axis indicates a diffraction angle (θ (deg)).

COMPARATIVE EXAMPLE

A laminate in which molybdenum (Mo) as the functional material layer and aluminum nitride (AlN) as the second wurtzite crystalline layer were formed on an Si monocrystalline substrate was manufactured as a comparative example of Example 2. That is, the laminate of Comparative Example was so formed as to have a structure in which the first wurtzite crystalline layer was omitted from the laminate shown in FIG. 3.

Figure 5:
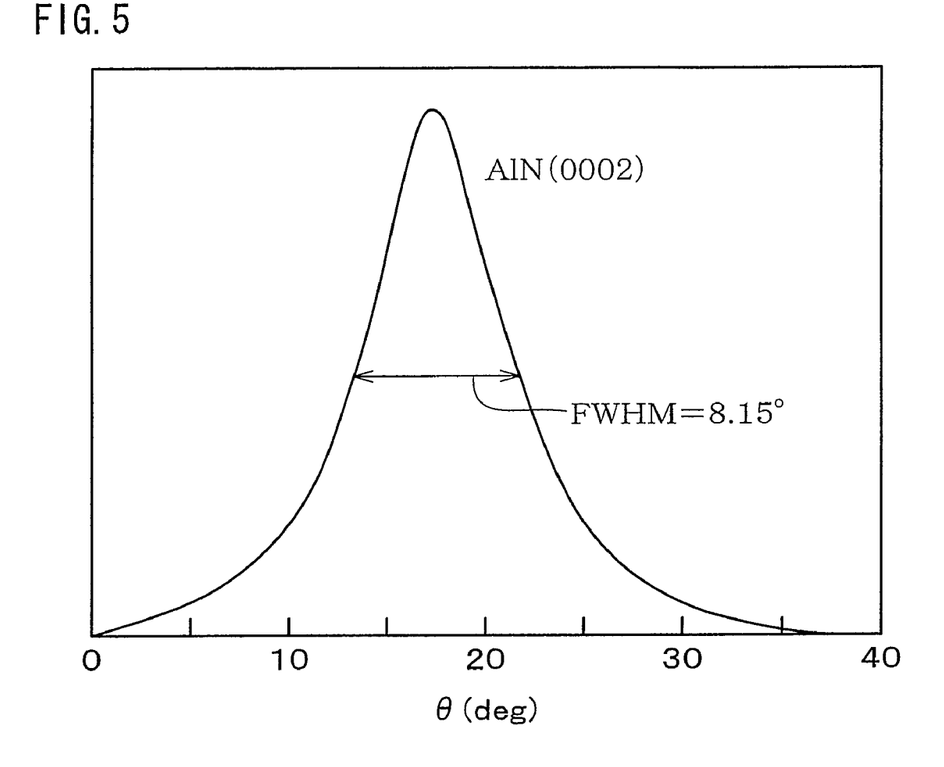
FIG. 5 shows a rocking curve of an AlN (0002) peak in an XRD measurement concerning an AlN/Mo/Si laminate manufactured in Comparative Example.

The films of molybdenum (Mo) and aluminum nitride (AlN) were formed by RF sputtering under the same conditions as those of Examples. The film of molybdenum (Mo) had the thickness of 200 nm, and the film of aluminum nitride (AlN) had the thickness of 1 μm. The half bandwidth of the rocking curve of the AlN (0002) peak was 8.15° as shown in FIG. 5, and the obtained film of aluminum nitride (AlN) had a c axis crystalline orientation that is worse than that of Examples. Note that in FIG. 5, a vertical axis indicates a peak intensity and a horizontal axis indicates a diffraction angle (θ (deg)).

INDUSTRIAL APPLICABILITY

As described above, according to the present invention, it is possible to manufacture the wurtzite thin film whose crystalline orientation is satisfactory and polarization directions are aligned in a uniform direction. The wurtzite thin film whose crystalline orientation is satisfactory and polarization directions are aligned in a uniform direction has better piezoelectric property than that of a conventional film, so that it can be effectively used as the electronic component material.

Moreover, in the laminate of the present invention, the wurtzite crystalline structure compound layer is formed in advance under the functional material layer. With this, the wurtzite crystalline structure compound layer whose crystallinity and crystalline orientation are satisfactory can be formed on the functional material layer having any crystalline structure.

Therefore, in the case of complexing the wurtzite crystalline structure compound with the functional material having conductivity and other property(s) in order for the application to the electronic component material, it is possible to keep the wurtzite crystalline structure compound high in quality. Therefore, there is a possibility that the application to various electronic component materials is realized.

The invention claimed is:

1. A laminate, which is applied as an electronic component material having a piezoelectric property, comprising:
a substrate which is insulating and which is made of any one of (i) a monocrystalline material, (ii) a polycrystalline material, and (iii) an amorphous material;
a first wurtzite crystalline layer, made of a wurtzite crystalline structure compound, which has a thickness of 50 nm to 200 nm and which is formed directly on the substrate so as to be in contact with an entire surface of the substrate;

a functional material layer which covers an entire surface of the first wurtzite crystalline layer and which is made of an elementary substance of molybdenum or tungsten or of a compound containing at least one of molybdenum and tungsten so as to have a thickness of 100 nm to 300 nm; and a second wurtzite crystalline layer which covers the functional material layer and is made of the wurtzite crystalline structure compound, and the first wurtzite crystalline layer, the functional material layer and the second wurtzite crystalline layer being stacked on or above the substrate in this order so as to have a four layer structure.

2. The laminate as set forth in claim 1, wherein a c axis perpendicular to a (0001) surface of the wurtzite crystalline structure compound constituting the first wurtzite crystalline layer and a c axis perpendicular to a (0001) surface of the wurtzite crystalline structure compound constituting the second wurtzite crystalline layer orient substantially perpendicular to a surface of the substrate.

3. The laminate as set forth in claim 1, wherein at least one of the first wurtzite crystalline layer and the second wurtzite crystalline layer contain as a main constituent one compound or more selected from the group consisting of aluminum nitride, gallium nitride, indium nitride and zinc oxide.

4. The laminate as set forth in claim 1, wherein the first wurtzite crystalline layer and the second wurtzite crystalline layer contain aluminum nitride as the main constituent.

5. The laminate as set forth in claim 1, wherein the first wurtzite crystalline layer and the second wurtzite crystalline layer are made of a same constituent(s).

6. The laminate as set forth in claim 1, wherein the functional material layer contains any one of a monocrystalline material, a polycrystalline material and an amorphous material.

7. The laminate as set forth in claim 1, wherein the functional material layer contains a conductive material.

8. The laminate as set forth in claim 1, wherein the functional material layer contains a metal.

9. The laminate as set forth in claim 8, wherein the functional material layer contains a metal having a body-centered cubic structure or a hexagonal close-packed lattice structure.

10. The laminate as set forth in claim 1, wherein the monocrystalline material is selected from silicon, sapphire, rock crystal, magnesium oxide, lithium niobate and lithium tantalite.

11. The laminate as set forth in claim 1, wherein the polycrystalline material is selected from aluminum oxide, silicon nitride, silicon carbide and zirconium oxide.

12. The laminate as set forth in claim 1, wherein the amorphous material is selected from glass, metallic glass and carbon.

* * * * *